(12) United States Patent
Oh

(10) Patent No.: US 11,991,429 B2
(45) Date of Patent: May 21, 2024

(54) CAMERA MODULE

(71) Applicant: LG INNOTEK CO., LTD., Seoul (KR)

(72) Inventor: Hyun Ah Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 324 days.

(21) Appl. No.: 17/310,909

(22) PCT Filed: Feb. 26, 2020

(86) PCT No.: PCT/KR2020/002738
§ 371 (c)(1),
(2) Date: Aug. 30, 2021

(87) PCT Pub. No.: WO2020/184870
PCT Pub. Date: Sep. 17, 2020

(65) Prior Publication Data
US 2022/0124227 A1    Apr. 21, 2022

(30) Foreign Application Priority Data
Mar. 13, 2019 (KR) .......................... 10-2019-0028665

(51) Int. Cl.
*H04N 23/54*    (2023.01)
*H04N 23/55*    (2023.01)
*H05K 1/18*    (2006.01)

(52) U.S. Cl.
CPC ............. *H04N 23/54* (2023.01); *H04N 23/55* (2023.01); *H05K 1/189* (2013.01)

(58) Field of Classification Search
None
See application file for complete search history.

(56) References Cited

U.S. PATENT DOCUMENTS

| 7,151,251 | B2 * | 12/2006 | Kim | ....................... H05K 3/363 |
| | | | | 257/434 |
| 2008/0100910 | A1 * | 5/2008 | Kim | ....................... G02B 5/282 |
| | | | | 359/356 |
| 2016/0190192 | A1 | 6/2016 | Grebet et al. | |
| 2018/0332202 | A1 * | 11/2018 | Lee | ........................ H04N 25/76 |

(Continued)

FOREIGN PATENT DOCUMENTS

| CN | 1844966 A | 10/2006 |
| CN | 107566691 A | 1/2018 |
| CN | 207251757 U | 4/2018 |

(Continued)

OTHER PUBLICATIONS

International Search Report dated Jun. 4, 2020 in International Application No. PCT/KR2020/002738.

(Continued)

*Primary Examiner* — James M Hannett
(74) *Attorney, Agent, or Firm* — Saliwanchik, Lloyd & Eisenschenk

(57) ABSTRACT

A camera module is provided. A camera module according to one aspect of the present invention comprises: a substrate comprising a window; an image sensor coupled to the lower surface of the substrate; and a filter coupled to the upper surface of the image sensor and arranged on the window.

20 Claims, 4 Drawing Sheets

(56) References Cited

U.S. PATENT DOCUMENTS

2021/0306530 A1\* 9/2021 Wang ..................... H04N 23/54

FOREIGN PATENT DOCUMENTS

| JP | 2008-283247 A | 11/2008 |
|----|---------------|---------|
| KR | 10-2011-0123567 A | 11/2011 |
| KR | 10-2017-0069913 A | 6/2017 |
| KR | 10-2019-0020096 A | 2/2019 |
| WO | 2017188781 A1 | 11/2017 |
| WO | 2018006673 A1 | 1/2018 |

OTHER PUBLICATIONS

Office Action dated Apr. 1, 2023 in Chinese Application No. 202080020888.9.

\* cited by examiner

CAMERA MODULE

CROSS-REFERENCE TO RELATED APPLICATIONS

This application is the U.S. national stage application of International Patent Application No. PCT/KR2020/002738, filed Feb. 26, 2020, which claims the benefit under 35 U.S.C. § 119 of Korean Application No. 10-2019-0028665, filed Mar. 13, 2019, the disclosures of each of which are incorporated herein by reference in their entirety.

TECHNICAL FIELD

The present embodiment relates to a camera module.

BACKGROUND ART

In general, the camera module may comprise a lens, a lens holder accommodating the lens, an image sensor converting an image of a subject collected by the lens into an electric signal, and a printed circuit board on which the image sensor is mounted. Such a camera module performs a function of photographing an image of a subject.

Recently, micro-camera modules have been developed, and micro-camera modules are widely used in small electronic products such as smart phones, notebook computers, and game consoles.

Accordingly, there is an urgent need to develop technologies for various methods and structures to reduce the size of camera modules.

DETAILED DESCRIPTION OF THE INVENTION

Technical Subject

The problem to be solved by the present invention is to provide a camera module capable of reducing the size of a product.

Technical Solution

A camera module according to an aspect of the present invention for achieving the above object comprises: a substrate comprising a window; an image sensor coupled to a lower surface of the substrate; and a filter coupled to an upper surface of the image sensor and disposed on the window.

In addition, the filter may be overlapped with the substrate in a direction perpendicular to the optical axis.

In addition, the image sensor may be flip-chip bonded to a lower surface of the substrate.

In addition, the filter may be overlapped with the image area of the printed circuit board in the optical axis direction.

In addition, it may comprise a flexible substrate coupled to the lower surface of the substrate.

In addition, the flexible substrate is disposed on one side of the image sensor, and only a portion of the flexible substrate may be overlapped with the substrate in the optical axis direction.

In addition, an upper surface of the flexible substrate and a lateral surface of the substrate may be bonded by an adhesive.

In addition, it may comprise a first molding portion surrounding a lower surface of the substrate and a lateral surface and a lower surface of the image sensor.

In addition, the substrate comprises an element disposed on an upper surface thereof, and may comprise a second molding portion surrounding an upper surface of the substrate and the element.

In addition, the substrate may comprise a plurality of protrusions protruding upward from an upper surface thereof, and the second molding portion may be disposed between the protrusions.

In addition, one of the protrusions is disposed adjacent to the window, and the other one may be disposed adjacent to a lateral surface of the substrate.

In addition, it may comprise a lens barrel coupled to an upper surface of the second molding portion.

In addition, the lens barrel may comprise a guide member being extended from a lower surface thereof and surrounding at least a portion of the second molding portion.

In addition, the guide member may be extended toward the inner side and lower side of the lens barrel.

A camera module according to this embodiment comprises: a substrate comprising a hole; a lens disposed on one side of the substrate; an image sensor disposed on the other side of the substrate and facing the lens through the hole; and a filter disposed between the lens and the image sensor, wherein an upper surface of the image sensor comprises an image area for converting light incident through the lens into an electrical signal, and a peripheral area disposed outside the image area, wherein an adhesive material adhered to the filter is disposed in the image area of the image sensor, and wherein the peripheral area of the image sensor and the substrate may be connected to each other by a conductive material.

Advantageous Effects

Through this embodiment, it is possible to provide a camera module capable of reducing the size of a product.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (comprising technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may comprise the plural form unless specifically stated in the phrase, and when described as "at least one (or more than one) of A and B and C", it may comprise one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also comprise cases of being 'connected', 'coupled', or 'interconnected' due that another component between that other components.

In addition, when described as being formed or disposed in "on (above)" or "below (under)" of each component, "on (above)" or "below (under)" means that it comprises not only the case where the two components are directly in contact with, but also the case where one or more other components are formed or disposed between the two components. In addition, when expressed as "on (above)" or "below (under)", the meaning of not only an upward direction but also a downward direction based on one component may be comprised.

The 'optical axis direction' used below is defined as the optical axis direction of a lens and/or image sensor coupled to the lens driving apparatus. Meanwhile, the 'optical axis direction' may correspond to an 'up-down direction', a 'z-axis direction', and the like.

Hereinafter, the present invention will be described in more detail with reference to the accompanying drawings.

Figure 1:
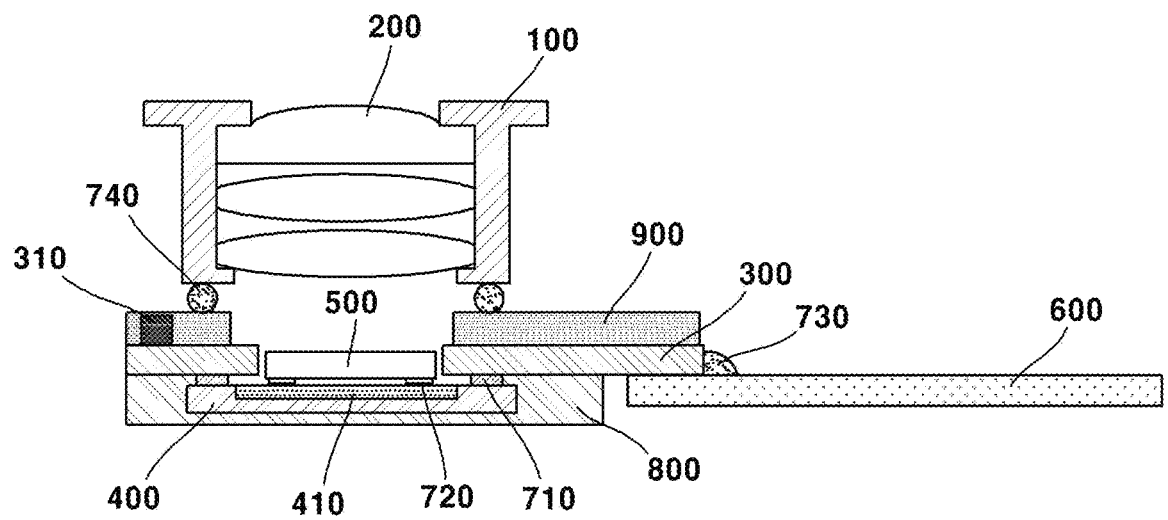
FIG. 1 is a schematic diagram of a camera module according to an embodiment of the present invention.
Figure 8:
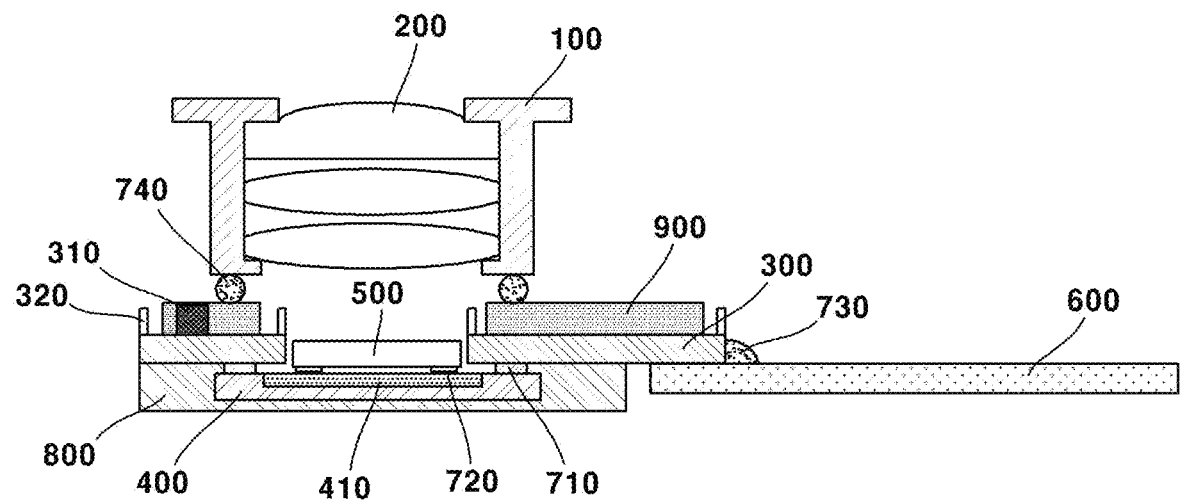
FIGS. 8 and 9 are schematic diagrams of a camera module according to an additional embodiment of the present invention.
Figure 9:
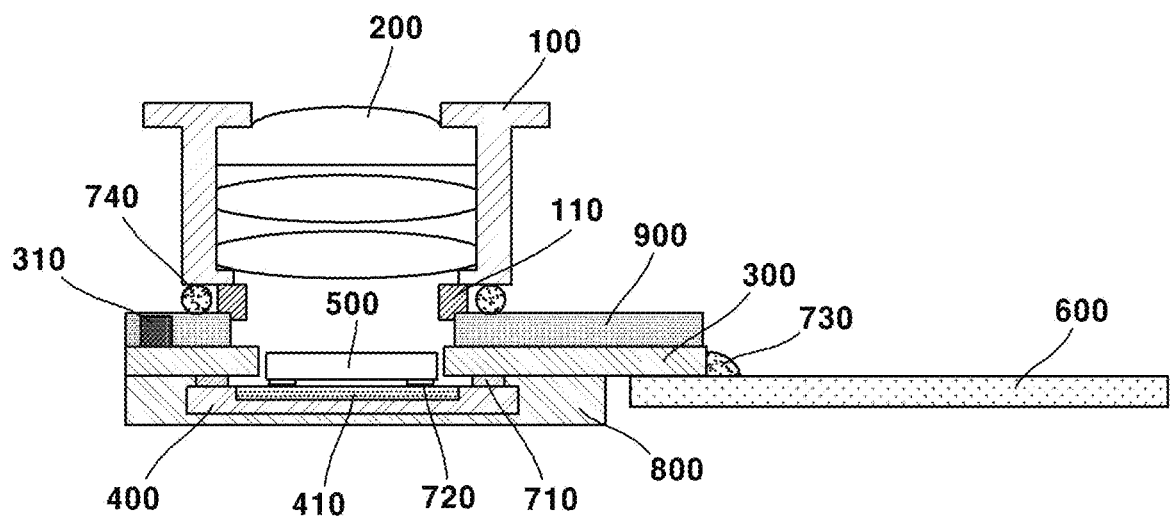

FIG. 1 is a schematic diagram of a camera module according to an embodiment of the present invention. FIGS. 2 to 7 are assembly views of a camera module according to an embodiment of the present invention. FIGS. 8 and 9 are schematic diagrams of a camera module according to an additional embodiment of the present invention.

Referring to FIGS. 1 to 9, the camera module according to an embodiment of the present invention comprises a lens barrel 100, a lens module 200, a substrate 300, an image sensor 400, a filter 500, and a flexible substrate 600, a first molding portion 800 and a second molding portion 900 may be comprised, however, it may be implemented excluding some of these configurations excluded, but it does not exclude additional configurations other than these.

The camera module may comprise a lens barrel 100. The lens barrel 100 may accommodate the lens module 200. At least one lens may be accommodated or fixed inside the lens barrel 100. The lens barrel 100 may be disposed on the second molding portion 900. The lens barrel 100 may be disposed on an upper surface of the second molding portion 900. The lens barrel 100 may be coupled to an upper surface of the second molding portion 900. The lens barrel 100 may be coupled to an upper surface of the second molding portion 900 through an adhesive 740 such as an epoxy. The lens barrel 100 may be made of a non-metal material such as a synthetic resin material using a plastic injection or die casting method. Unlike this, the lens barrel 100 may be formed of a metal material and may be coated with a non-metal material such as plastic. In one embodiment of the present invention, the lens barrel 100 is described as an example that is formed in a cylindrical shape, but the shape of the lens barrel 100 is not limited thereto, and the shape of the lens barrel 100 may be variously changed.

The lens barrel 100 may comprise a through hole. The through hole may be formed to be extended in the optical axis direction. The through hole may be formed in a shape corresponding to the lens module 200. At least one lens may be accommodated or fixed in the through hole. The through hole may be formed larger than an image area 410 of the image sensor 400.

Referring to FIG. 9, the lens barrel 100 may comprise a guide member 110. At least a portion of the guide member 110 may surround at least a portion of the second molding portion 900. The guide member 110 may be formed to be extended downward and inward from a lower surface or an inner lateral surface of the lens barrel 100. The guide member 110 may surround a lateral surface and/or an upper surface of the second molding portion 900. Through this, the position of the lens barrel 100 disposed on the second molding portion 900 can be guided, so that it is easy to couple the lens barrel 100 to the second molding portion 900 by using an adhesive 740 or the like.

The camera module may comprise a lens module 200. The lens module 200 may be disposed inside the lens barrel 100. The lens module 200 may be coupled to a through hole of the lens barrel 100. The lens module 200 may be accommodated in the through hole of the lens barrel 100. The lens module 200 may be coupled to the through hole of the lens barrel 100 by an adhesive (not shown). For example, the lens module 200 may be screw-coupled into the through hole of the lens barrel 100. Light passing through the lens module 200 may be irradiated onto the image area 410 of the image sensor 400 mounted on the substrate 300. The lens module 200 may be made of a material, a glass material, a quartz material, or the like but is not limited thereto and may be made of various materials.

The lens module 200 may comprise at least one lens. The plurality of lenses of the lens module 200 may be disposed to be spaced apart from one another in the optical axis direction. The plurality of lenses of the lens module 200 may have different sizes.

The camera module may comprise a substrate 300. An element 310 may be disposed on an upper surface of the substrate 300. The image sensor 400 may be disposed on the lower surface of the substrate 300. The image sensor 400 may be mounted on the lower surface of the substrate 300. The substrate 300 may be overlapped with the filter 500 in a direction perpendicular to the optical axis. A flexible substrate 600 may be disposed on a lower surface of the substrate 300. The flexible substrate 600 may be coupled to a lower surface of the substrate 300. At least a portion of the lower surface of the substrate 600 may be wrapped and sealed by the first molding portion 800. At least a portion of an upper surface of the substrate 600 may be wrapped and sealed by the second molding portion 800. The substrate 600 may comprise a printed circuit board (PCB), but is not limited thereto.

The substrate 300 may comprise a window 302. The window 302 may be formed in a central region of the substrate. The window 302 may comprise a hole. The window 302 may be overlapped with the image area 410 of the image sensor 400 in the optical axis direction. The window 302 may be overlapped with a portion of the image area 410 of the image sensor 400 in the optical axis direction. The window 302 may be overlapped with the filter 500 in a direction perpendicular to the optical axis. The inner circumferential surface of the substrate 300 on which the window 302 is formed may be spaced apart from the filter 500. The window 302 may be formed in a rectangular shape or a circular shape, but is not limited thereto and may be variously changed according to the product.

Referring to FIG. 8, the substrate 300 may comprise a protrusion 320. The protrusion 320 may be formed to be protruded upward from an upper surface of the substrate 300. The protrusion 320 may be formed in a strip shape. The protrusion 320 may comprise a plurality of protrusions. A second molding portion 900 may be disposed between the protrusions. One of the protrusions may be disposed adjacent to the window 302. The other one of the protrusions may be disposed adjacent to the lateral surface of the substrate 300. Through this, it is possible to inhibit foreign matters from flowing into at least one of the image sensor 400, the filter 500, and the flexible substrate 600 during the molding operation of an upper surface of the substrate 300 and the element 310.

The camera module may comprise an image sensor 400. The image sensor 400 may be disposed in a lower portion of the substrate 300. The image sensor 400 may be mounted on a lower surface of the substrate 300. The image sensor 400 may be electrically connected to the substrate 300. The image sensor 400 may be coupled to a lower surface of the substrate 300 by a flip chip bonding. The flip chip bonding may refer to a coupling method in which a surface electrode on a chip is directly connected to an insulating substrate or an electrode for wiring of a package. Unlike this, the image sensor 400 may be coupled to a lower surface of the substrate 300 by a surface mounting technology (SMT).

The optical axis of the image sensor 400 may be aligned with the optical axis of the lens module 200. The optical axis of the image area 410 of the image sensor 400 may be aligned with the optical axis of the lens module 200. Through this, the image sensor 400 may acquire light passing through at least one lens. The image sensor 400 may convert light irradiated to the image area 410 of the image sensor 400 into an electrical signal. The image sensor 400 may be any one of a charge coupled device (CCD), a metal oxide semiconductor (MOS), a CPD, and a CID. However, the type of the image sensor 400 is not limited thereto, and the image sensor 400 may comprise any configuration capable of converting incident light into an electrical signal.

A filter 500 may be disposed in the image area 410 of the image sensor 400. The image area 410 may be formed on an upper surface of the image sensor 400. The image area 410 may be formed in a central area of the image sensor 400. The image area 410 may have a rectangular shape, a circular shape, or an elliptical shape. A filter 500 may be coupled to an upper surface of the image area 410. The image area 410 may be overlapped with the lens module 200 in the optical axis direction. The image area 410 may be overlapped with the flexible substrate 600 in a direction perpendicular to the optical axis. The upper surface of the image sensor 400 may comprise an image area 410 and a peripheral area disposed outside the image area 410. An adhesive material adhered to the filter 500 may be disposed on the image area 410 of the image sensor 400. The peripheral area of the image sensor 400 and the substrate 300 may be connected by a conductive material 710. The peripheral area of the image sensor 400 may be coupled to a lower surface of the substrate 300 through a conductive material 710. The image sensor 400 may be electrically connected to the substrate 300 through a conductive material 710.

The camera module may comprise a filter 500. The filter 500 may be disposed on the image sensor 400. The filter 500 may be coupled to an upper surface of the image sensor 400. The filter 500 may be disposed on an upper surface of the image area 410 of the image sensor 400. The filter 500 may be coupled to an upper surface of the image area 410 of the image sensor 400 through an adhesive 720 or an adhesive film. The filter 500 may be directly coupled to an upper surface of the image area 410. The filter 500 may be disposed on the window 302 of the substrate 300. The filter 500 may be overlapped with the substrate 300 in a direction perpendicular to the optical axis. The filter 500 may be overlapped with a portion of the image area 410 of the printed circuit board 400 in the optical axis direction.

The filter 500 may comprise an infrared filter. The filter 500 may block infrared light from entering the image area 410 of the image sensor 400. The filter 500 may be disposed below the lens module 200. The filter 500 may be spaced apart from the lens barrel 100 and the lens module 200. The filter 500 may be formed by coating an infrared blocking coating material on a flat optical filter such as a cover glass or cover glass for protecting an imaging surface. For example, the filter 500 may be an infrared absorption filter (Blue filter) that absorbs infrared rays. As another example, the filter 500 may be an IR cut filter that reflects infrared rays.

The camera module may comprise a flexible substrate 600. The flexible substrate 600 may be disposed under the substrate 300. The flexible substrate 600 may be coupled to a lower surface of the substrate 300. An upper surface of the flexible substrate 600 and a lateral surface of the substrate 300 may be bonded by an adhesive 730. The flexible substrate 600 may be electrically connected to the substrate 300. The flexible substrate 600 may comprise a flexible printed circuit board (FPCB). The flexible substrate 600 may be disposed on one side of the image sensor 400. Only a portion of the flexible substrate 600 may be overlapped the substrate 300 in the optical axis direction. The flexible substrate 600 may be overlapped with the image sensor 400 in a direction perpendicular to the optical axis. The flexible substrate 600 may deliver power to the substrate 300 from the outside, or may deliver power from the substrate 300 to other components in the camera module.

The camera module may comprise a first molding portion 800. The first molding portion 800 may surround a lower surface of the substrate 300, a lateral surface of the image sensor 400, and a lower surface of the image sensor 400. The first molding portion 800 may seal at least a portion of the lower surface of the substrate 300, the lateral surface of the image sensor 400, and the lower surface of the image sensor 400. Through this, it is possible to inhibit foreign substances from infiltrating into the image sensor 400. The first molding portion 800 may be an EMC material or an adhesive such as epoxy.

The camera module may comprise a second molding portion 900. The second molding portion 900 may wrap an upper surface of the substrate 300 and an element 310 disposed on an upper surface of the substrate 300. The second molding portion 900 may seal at least a portion of an upper surface of the substrate 300 and the element 310 disposed on an upper surface of the substrate 300. Through this, it is possible to inhibit foreign substances from infiltrating into the element 310 mounted on the substrate 300. The second molding portion 900 may be an EMC material or an adhesive such as epoxy.

In the embodiment of the present invention, the filter 500 is spaced apart from the inner lateral surface forming the window 302 of the substrate 300, but unlike this, the filter 500 may be in close contact with an inner lateral surface of the substrate 300 forming the window 302. In this case, since there is no gap between the filter 500 and the inner lateral surface forming the window 302 of the substrate 300, the second molding portion 900 may inhibit foreign substances from infiltrating into the image sensor 400 from the upper portion.

Hereinafter, assembly of a camera module according to an embodiment of the present invention will be described with reference to FIGS. 2 to 7.

Figure 2:
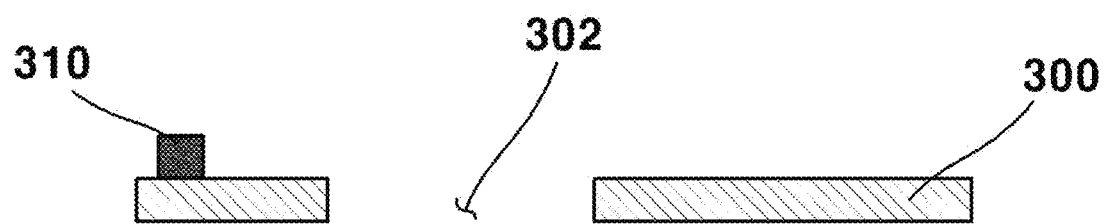
FIGS. 2 to 7 are assembly views of a camera module according to an embodiment of the present invention.
Figure 3:
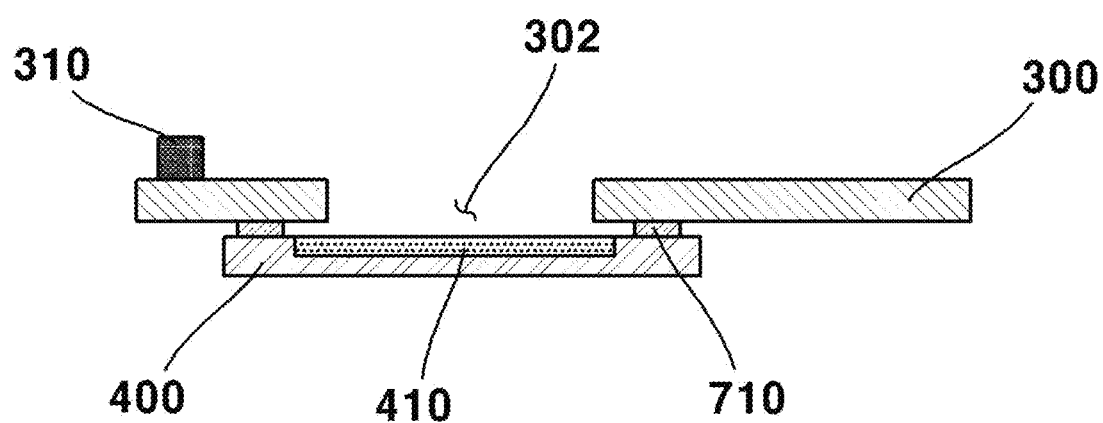

Referring to FIGS. 2 and 3, the image sensor 400 is coupled to a lower surface of the substrate 300 by flip chip bonding. Unlike this, the image sensor 400 may be coupled to a lower surface of the substrate 300 by a surface mounting technology (SMT). In this case, an area of an upper surface of the image sensor 400 other than the image area 410 is coupled to a lower surface of the substrate 300. Through this, the image area 410 is widened and damage to the image area 410 can be inhibited.

Figure 4:
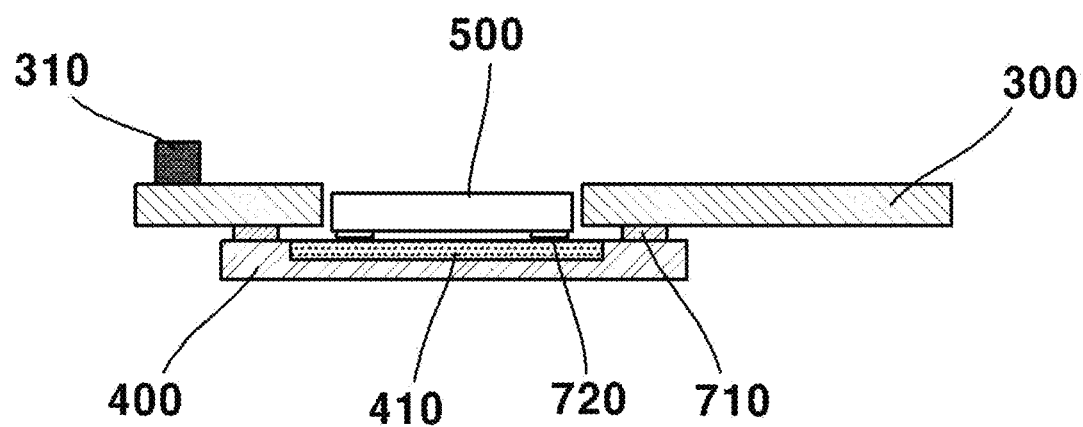

Referring to FIGS. 3 and 4, the filter 500 is coupled to an upper surface of the image sensor 400 through an adhesive 720 or an adhesive film. In this case, the filter 500 may be coupled to an upper surface of the image area 410 of the image sensor 400. Since the filter 500 is mounted on the image sensor 400 without a separate configuration, the height of the product can be reduced. In this case, an adhesive 720 or an adhesive film is applied on an upper surface of the image sensor 400 and the filter 500 is aligned to the image area 410, and then the filter 500 may be coupled to the upper surface of the image sensor 400 through the curing operation.

Figure 5:
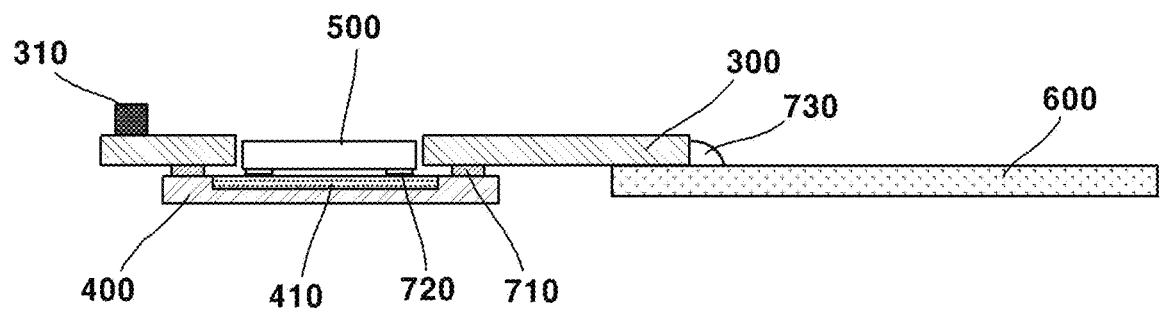

Referring to FIGS. 4 and 5, the flexible substrate 600 is coupled to a lower surface of the substrate 300. In this case, the flexible substrate 600 may be coupled to the substrate 300 by placing an adhesive 730 on a lateral surface of the substrate 300 and an upper surface of the flexible substrate 600. In this case, since a space for placing the adhesive 730 between the flexible substrate 600 and the substrate 300 can be eliminated, the height of the product can be reduced.

Figure 6:
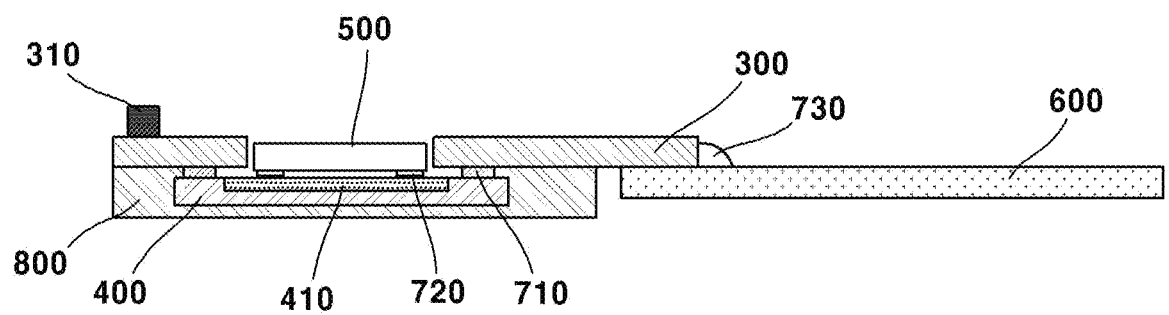

Referring to FIGS. 5 and 6, a molding operation is performed to surround the lower surface of the substrate 300, the lateral surface of the image sensor 400, and the lower surface of the image sensor 400. In this case, it is possible to inhibit foreign substances from infiltrating into the image sensor 400.

Figure 7:
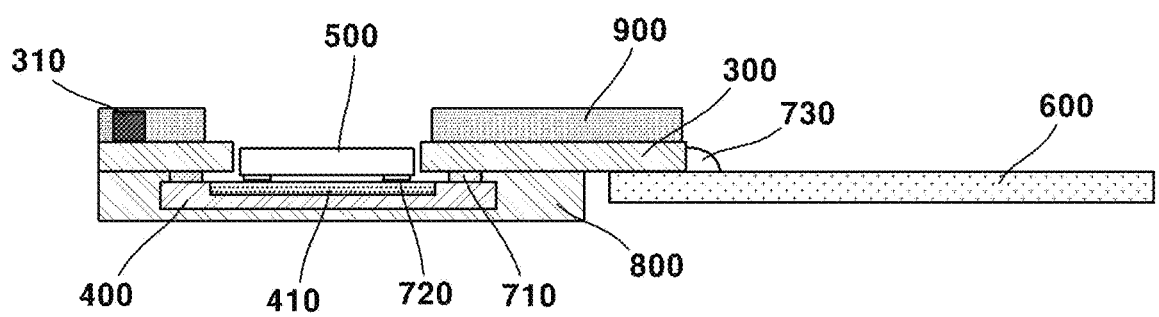

Referring to FIGS. 6 and 7, a molding operation is performed to surround at least a portion of an upper surface of the substrate 300 and the element 310. In this case, it is possible to inhibit foreign substances from infiltrating into the image sensor 400, the filter 500, and components mounted on the substrate 300.

Referring to FIGS. 7 and 1, the lens barrel 100 is coupled to an upper surface of the second molding portion 900. In this case, since the lens barrel 100 is fixed to the second molding portion 900 without a separate configuration such as housing, and the optical axis of the lens module 200 and the optical axis of the image sensor 400 can be aligned, so that the height of the product can be reduced.

The embodiments of the present invention have been described above with reference to the accompanying drawings, but a person skilled in the art to which the present invention belongs may understand that the present invention can be implemented in other specific forms without changing the technical spirit or essential features. Therefore, it should be understood that the embodiments described above are illustrative and non-limiting in all respects.

The invention claimed is:

1. A camera module comprising:
a substrate comprising a window;
an image sensor coupled with a lower surface of the substrate;
a filter coupled with an upper surface of the image sensor and disposed on the window;
a second molding portion disposed on an upper surface of the substrate;
a lens barrel disposed on the second molding portion; and
a lens coupled with the lens barrel,
wherein the lens barrel is coupled with an upper surface of the second molding portion through an adhesive,
wherein the lens barrel comprises a guide member,
wherein the guide member extends downward and inward from a lower surface or an inner lateral surface of the lens barrel and is disposed on the second molding portion,
wherein the guide member is overlapped with the adhesive in a direction perpendicular to an optical axis direction, and
wherein the guide member is disposed further inward than the adhesive.

2. The camera module of claim 1, wherein the filter is overlapped with the substrate in the direction perpendicular to the optical axis direction.

3. The camera module of claim 1, wherein the image sensor is flip-chip bonded to the lower surface of the substrate.

4. The camera module of claim 1, wherein the filter is overlapped with an image area of the image sensor in the optical axis direction.

5. The camera module of claim 1, comprising a flexible substrate coupled to the lower surface of the substrate.

6. The camera module of claim 5, wherein the flexible substrate is disposed at one side of the image sensor, and
wherein only a portion of the flexible substrate is overlapped with the substrate in the optical axis direction.

7. The camera module of claim 6, wherein an upper surface of the flexible substrate and a lateral surface of the substrate are bonded by an adhesive.

8. The camera module of claim 1, comprising a first molding portion surrounding the lower surface of the substrate and lateral and lower surfaces of the image sensor.

9. The camera module of claim 1, wherein the substrate comprises an element disposed on an upper surface of the substrate, and
wherein the second molding portion surrounds the upper surface of the substrate and the element.

10. A camera module comprising:
a substrate comprising a hole;
a lens disposed at one side of the substrate;
an image sensor disposed at an other side of the substrate and facing the lens through the hole;
a filter disposed between the lens and the image sensor;
a second molding portion disposed on an upper surface of the substrate; and
a lens barrel disposed on the second molding portion,
wherein the lens is coupled with the lens barrel,
wherein an upper surface of the image sensor comprises an image area for converting light incident through the lens into an electrical signal, and a peripheral area disposed outside the image area,
wherein an adhesive material adhered to the filter is disposed in the image area of the image sensor,
wherein the peripheral area of the image sensor and the substrate are connected to each other by a conductive material, wherein the lens barrel is coupled with an upper surface of the second molding portion through an adhesive, wherein the lens barrel comprises a guide member, wherein the guide member extends downward and inward from a lower surface or an inner lateral surface of the lens barrel and is disposed on the second molding portion, wherein the guide member is overlapped with the adhesive in a direction perpendicular to an optical axis direction, and wherein the guide member is disposed further inward than the adhesive.

11. The camera module of claim 1, wherein the image sensor is not overlapped with the substrate in the direction perpendicular to the optical axis direction.

12. The camera module of claim 1, wherein the filter is directly coupled to the upper surface of the image sensor by an adhesive member.

13. The camera module of claim 1, wherein the image sensor is overlapped with the substrate in the optical axis direction.

14. The camera module of claim 9, wherein the substrate comprises a protrusion protruding from an upper surface of the substrate, wherein the protrusion comprises two protrusions spaced apart from each other, and wherein the second molding portion is disposed between the two protrusions in the direction perpendicular to the optical axis direction.

15. The camera module of claim 1, wherein the guide member surrounds at least a portion of an inner lateral surface of the second molding portion.

16. A smart phone comprising the camera module of claim 1.

17. A camera module comprising:
a substrate comprising a hole;
a lens disposed above the substrate;
an image sensor disposed below the substrate and facing the lens through the hole of the substrate;
a filter disposed between the lens and the image sensor;
a second molding portion disposed on an upper surface of the substrate; and
a lens barrel disposed on the second molding portion, wherein the lens is coupled with the lens barrel, wherein a portion of the image sensor is overlapped with the substrate in an optical axis direction, wherein the filter is disposed in the hole of the substrate so that the filter is overlapped with the substrate in a direction perpendicular to the optical axis direction, wherein the lens barrel is coupled with an upper surface of the second molding portion through an adhesive, wherein the lens barrel comprises a guide member, wherein the guide member extends downward and inward from a lower surface or an inner lateral surface of the lens barrel and is disposed on the second molding portion, wherein the guide member is overlapped with the adhesive in the direction perpendicular to the optical axis direction, and wherein the guide member is disposed further inward than the adhesive.

18. The camera module of claim 17, comprising a first molding portion surrounding a lower surface of the substrate and lateral and lower surfaces of the image sensor.

19. The camera module of claim 17, comprising:
an element disposed on an upper surface of the substrate,
wherein the second molding portion surrounds the upper surface of the substrate and the element.

20. The camera module of claim 17, wherein the filter is directly coupled to an upper surface of the image sensor by an adhesive member.

* * * * *